United States Patent
Watkins

(10) Patent No.: US 6,654,919 B1
(45) Date of Patent: Nov. 25, 2003

(54) AUTOMATED SYSTEM FOR INSERTING AND READING OF PROBE POINTS IN SILICON EMBEDDED TESTBENCHES

(75) Inventor: Daniel Watkins, Saratoga, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/550,764

(22) Filed: Apr. 17, 2000

(51) Int. Cl.$^7$ ............................................... G01R 31/28
(52) U.S. Cl. ......................... 714/733; 714/741; 703/28; 257/48; 257/690
(58) Field of Search ................................ 714/724, 733, 714/32–33, 38, 725, 734, 741; 713/100; 703/26, 28, 23; 716/1, 3, 4, 5, 13–18; 717/174–178; 348/180; 345/723; 324/537, 758; 374/1, 130; 250/306, 307, 309; 257/48, 690

(56) References Cited

U.S. PATENT DOCUMENTS

| 5,727,187 A | * | 3/1998 | Lemche et al. ................ 716/18 |
| 5,960,191 A | * | 9/1999 | Sample et al. ................ 703/28 |
| 6,247,147 B1 | * | 6/2001 | Beenstra et al. .............. 714/39 |

OTHER PUBLICATIONS

Jones et al. 'Verification techniques for a MIPS compatible embedded control Processor; IEEE International Conference on Computer Design; p.(s): 329–332, Oct. 16, 1991.'*

Tago et al. 'Importance of CAD tools and methodologies in high speed CPU design; Design Automation Conference, Proceedings of the ASP–DAC 2000. Asia and South Pacific, p.(s): 631–633, Jan. 28, 2000'.*

Berekovic et al. 'A core generator for fully synthesizable and highly parameterizable RISC–cores for system–on–chip designs; IEEE Workshop on Signal Processing Systems, p.(s): 561–568, Oct. 10, 1998'.*

"DVD Systems Silicon Verification Perspective", By Daniel Watkins, Mar. 13, 1996.

"DVD Design Verification Activity Update Since Aug., 1997 Conference", By Daniel Watkins, May 29, 1998.

IDForm "Silicon Verification with Embedded Tesbenches", Apr. 3, 1998, pp. 1–7.

Audio Processing Engine Architecture Spec. By Ronen Perets, Sep. 29, 1997, pp. 1–1 through 6–107.

* cited by examiner

Primary Examiner—Emmanuel L. Moise
Assistant Examiner—Guy Lamarre

(57) ABSTRACT

A method for inserting and reading probe points in a silicon embedded testbench comprising the steps of (a) reading a simulation list of probe points, (b) enabling access to the list of probe points, (c) generating a core, and (d) displaying or comparing the probe points.

23 Claims, 6 Drawing Sheets

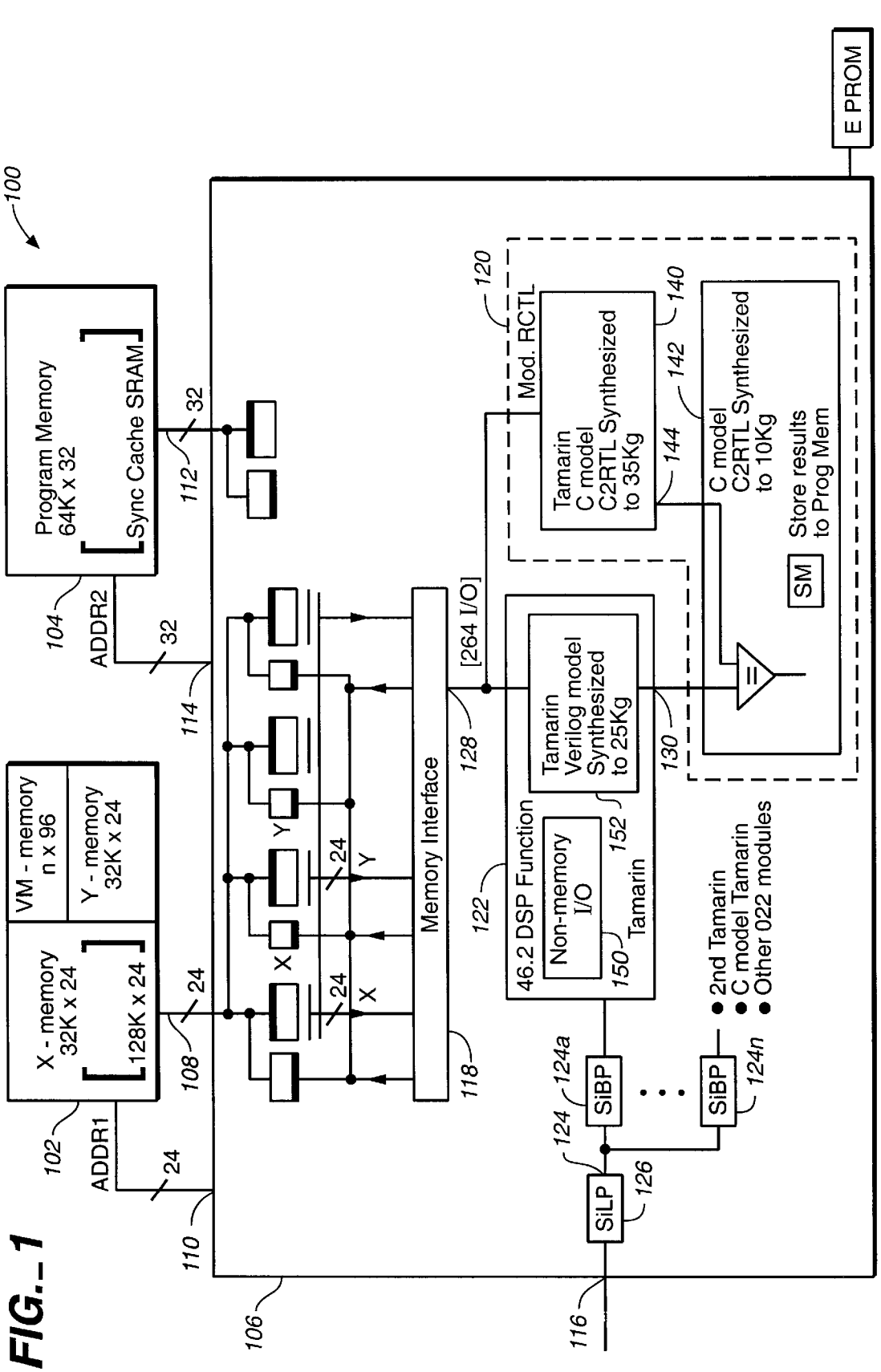
FIG._1

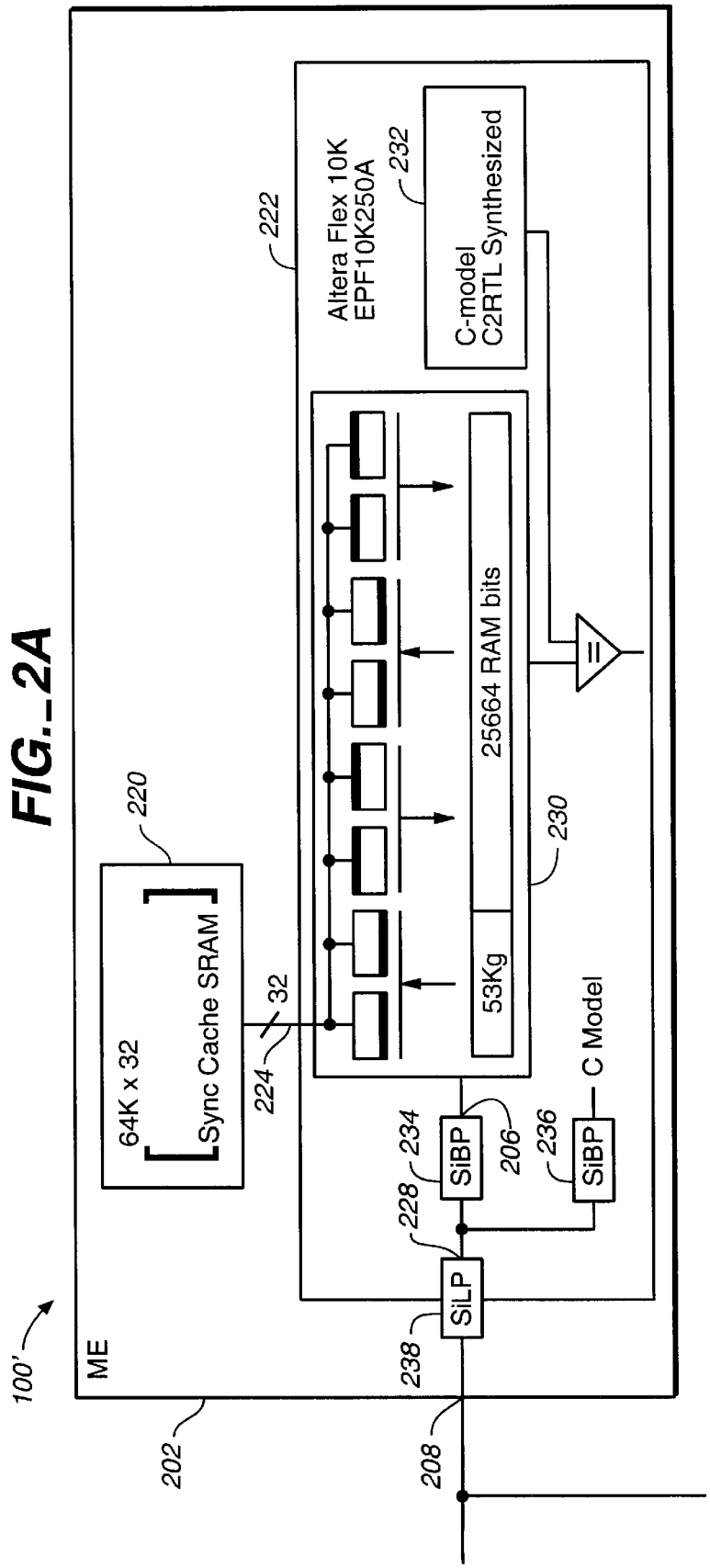
FIG._2
FIG._2A | FIG._2B
FIG._2A

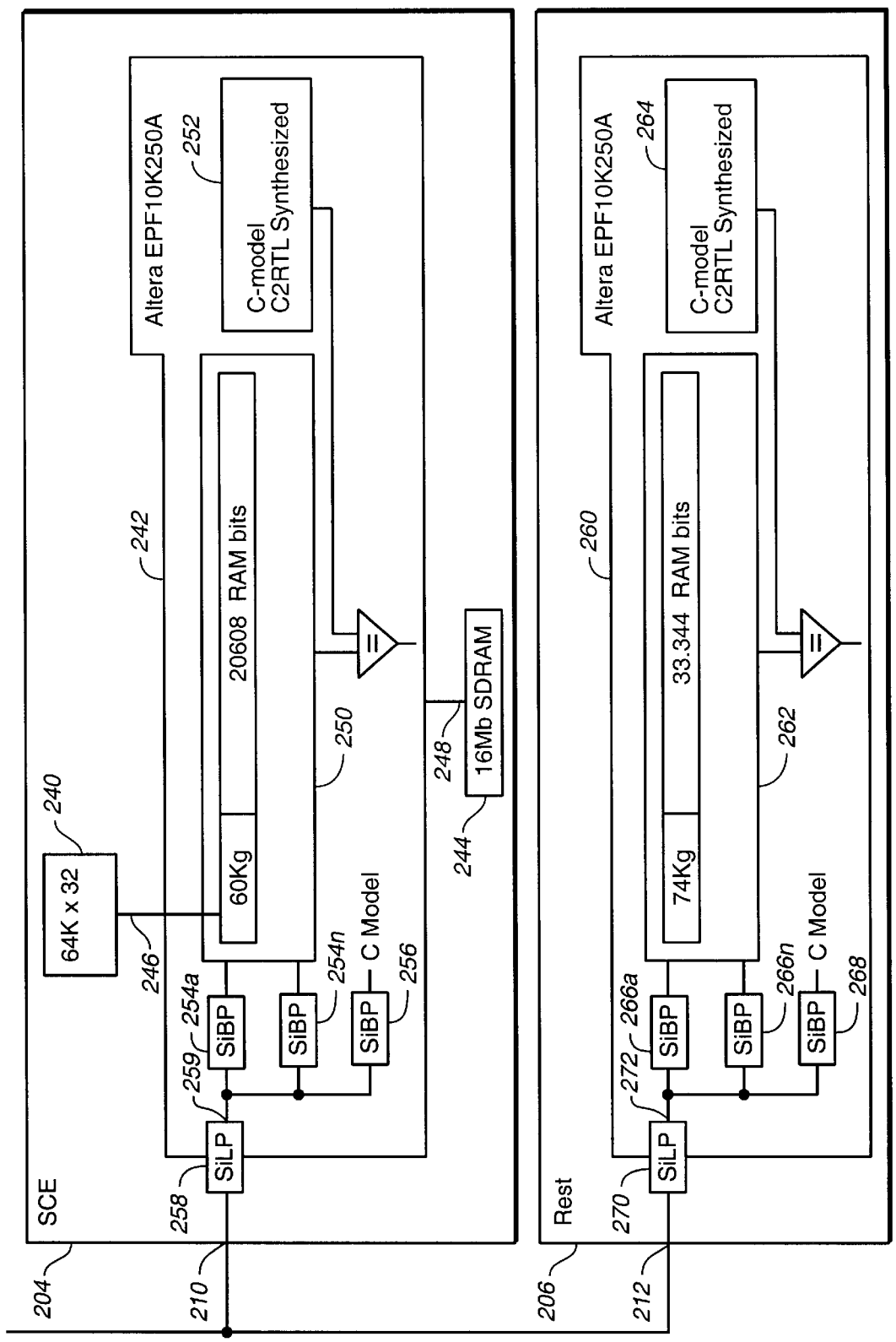
FIG._2B

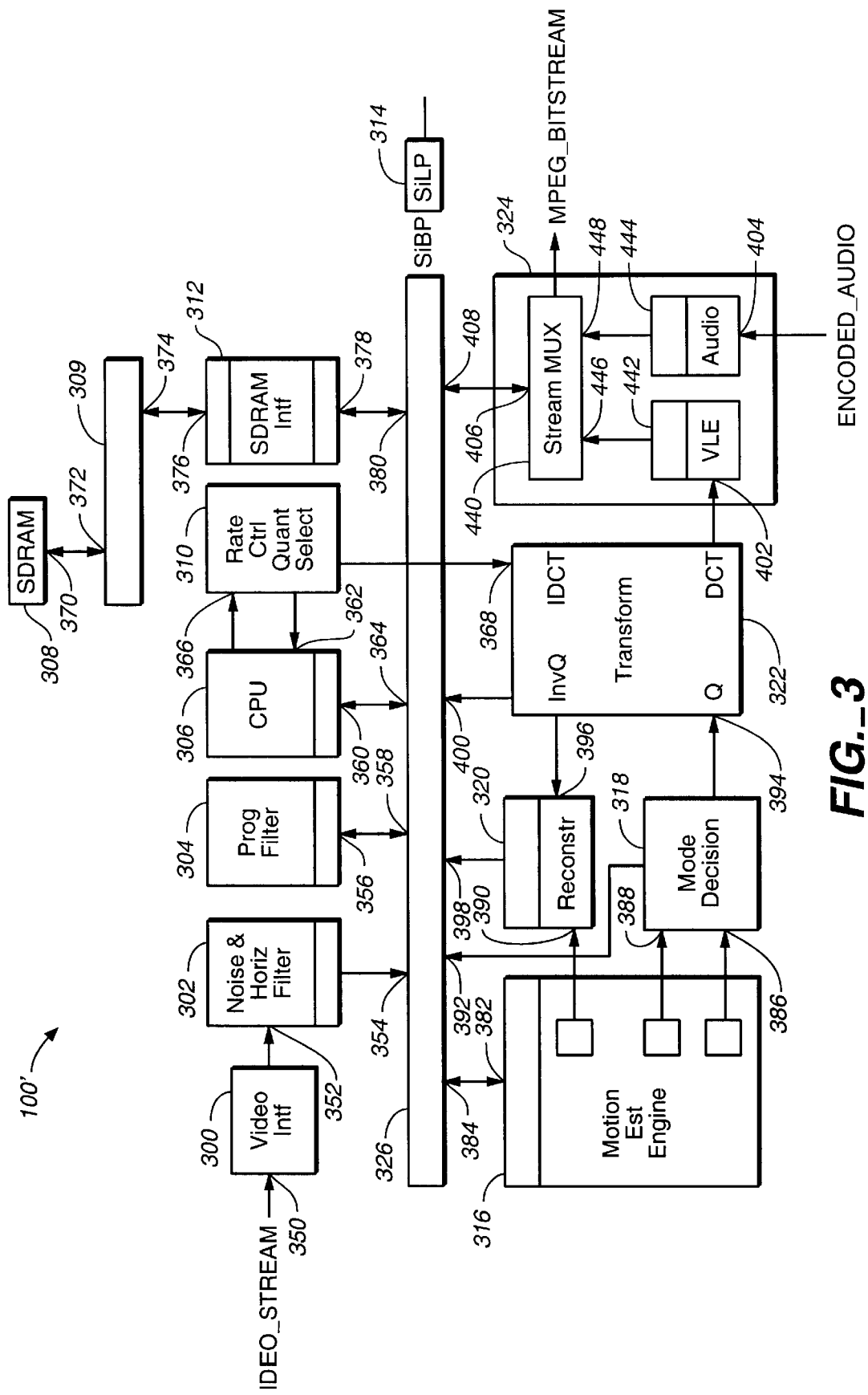
FIG._3

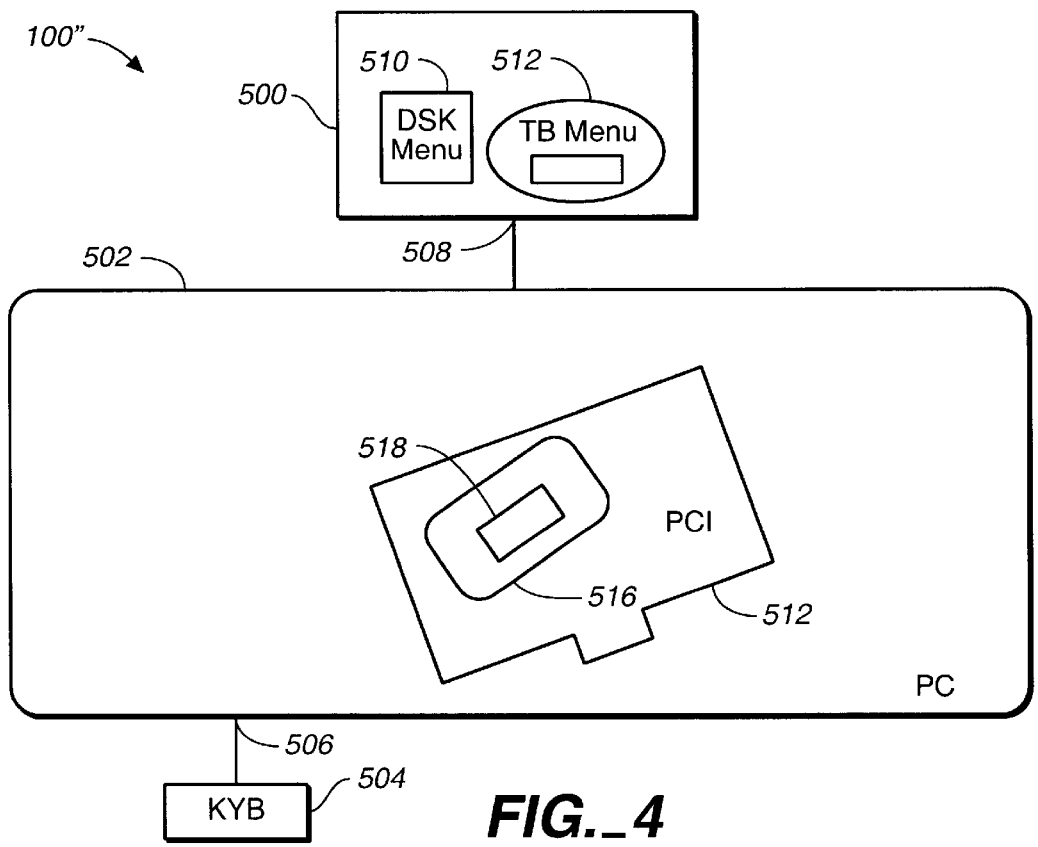
FIG._4
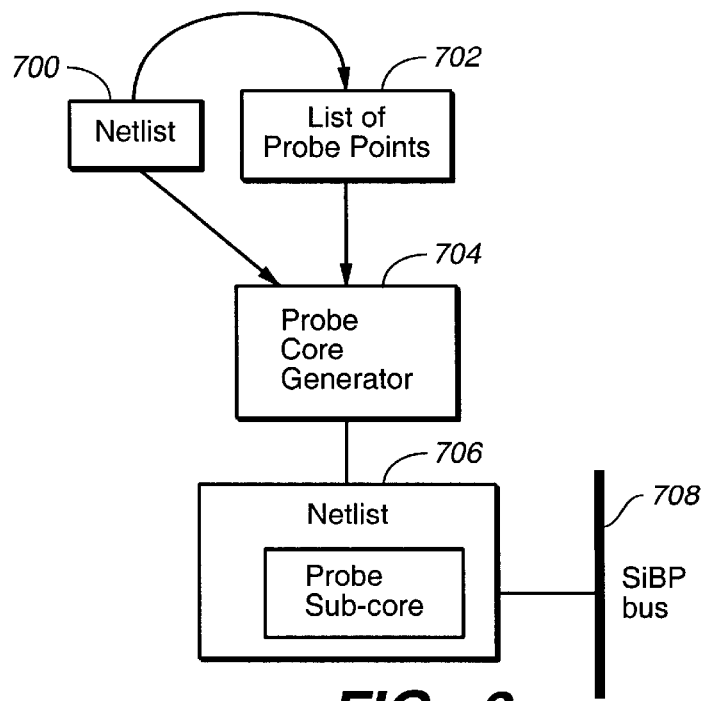
FIG._6

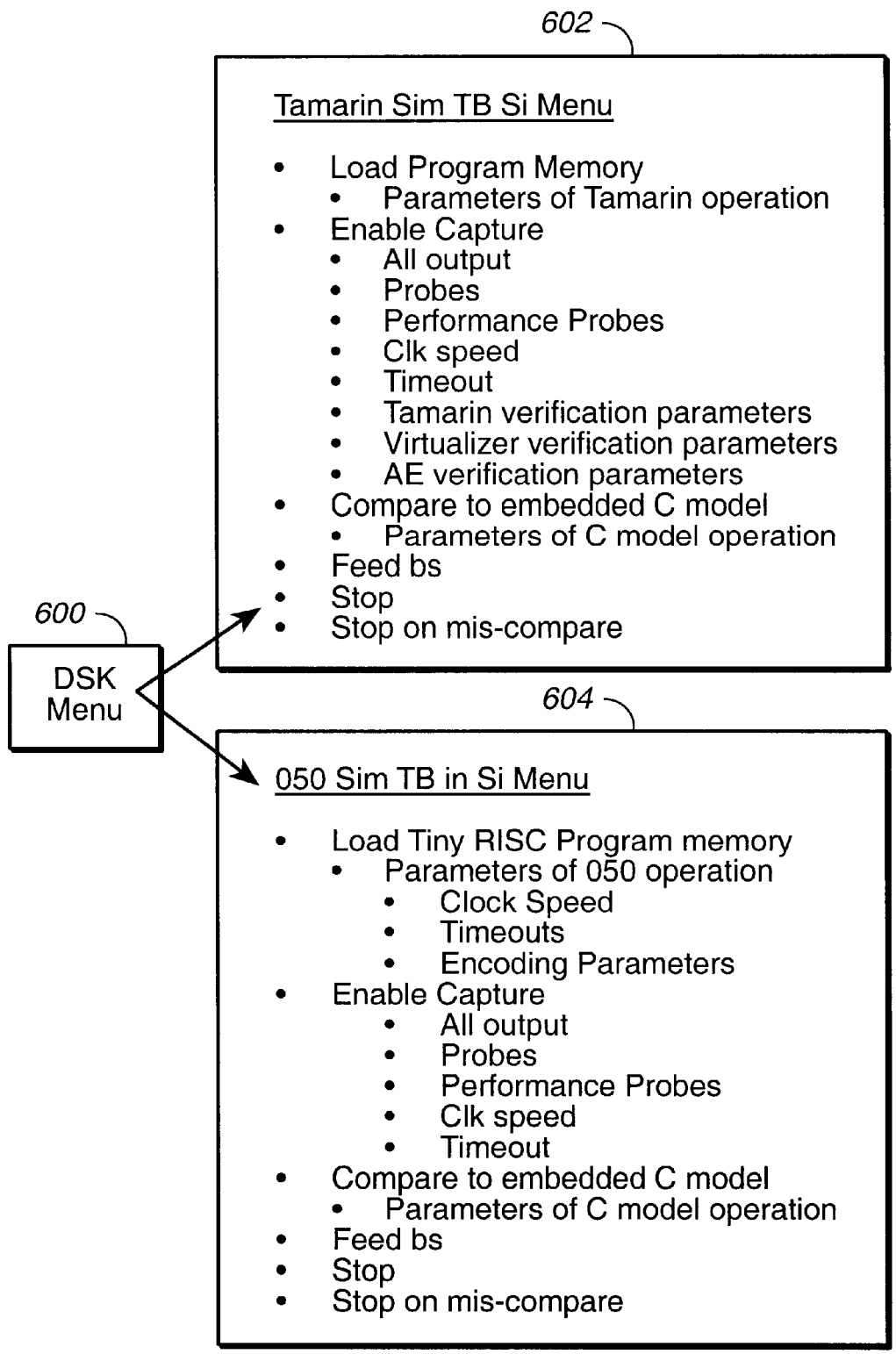
FIG._5

AUTOMATED SYSTEM FOR INSERTING AND READING OF PROBE POINTS IN SILICON EMBEDDED TESTBENCHES

FIELD OF THE INVENTION

The present invention relates to silicon embedded testbenches generally and, more particularly, to inserting and reading probe points in silicon embedded testbenches.

BACKGROUND OF THE INVENTION

Conventional approaches for inserting and reading probe points in silicon embedded testbenches are not known. Conventional hardware emulation can have probe points. The probe points of conventional hardware emulation are not added via multiplexers to system on chip (SOC) busses at a module boundary in a systematic and automated way. Additionally, conventional probe points are not silicon embedded. Rather, the probe points are implemented. as field programmable gate arrays (FPGAs). Furthermore, hardware emulation does not provide embedded testbenches.

Co-pending application Ser. No. 09/400,686, filed Sep. 22, 1999, now U.S. Pat. No. 6,417,562, which is hereby incorporated by reference in its entirety, describes one solution for embedding testbenches in silicon. However, such an approach does not have a systematic method of adding probe points from simulation.

SUMMARY OF THE INVENTION

The present invention concerns a method for inserting and reading probe points in a silicon embedded testbench comprising the steps of (a) reading a simulation list of probe points, (b) enabling access to the list of probe points, (c) generating a core, and (d) displaying or comparing the probe points.

The objects, features and advantages of the present invention include providing a method and/or architecture for inserting and reading of probe points in silicon embedded testbenches that may (i) systematically embed probe point real-time and store state information programmed into silicon with a testbench; (ii) directly or indirectly embed probe point capability built from simulation probe point information; (iii) generate an extensive list of probe core generator parameters that may enable optimum access to probe points in silicon with minimal impact on design (e.g., including options for capture on changes only and/or capture at a specific time); (iv) automatically and/or quickly provide incremental builds to add or subtract probe points in terms of implementation in FPGAs; (v) provide testbenches embedded in silicon for verification of external SOC devices to have a model of a function that is not yet in silicon (e.g., to integrate entire SOC simulation environment models); (vi) provide an evaluation system to leverage embedded testbench probes, with menu programming for extracting probe information available from silicon; (vii) provide a testbench that may include loading up program memory of modules or chip under test; (viii) provide a testbench that may include loading simulation information either directly or indirectly in response to extracted probe information; and/or (ix) provide field diagnosis on issues that may be done with embedded testbenches with probe points accessible to the system with silicon.

BRIEF DESCRIPTION OF THE DRAWINGS

These and other objects, features and advantages of the present invention will be apparent from the following detailed description and the appended claims and drawings in which:

FIG. 1 is a block diagram of a preferred embodiment of the present invention;

FIG. 2 is a detailed block diagram of another embodiment of the present invention;

FIG. 3 is a detailed block diagram of the invention implemented in FIG. 2;

FIG. 4 is a block diagram illustrating an implementation of the present invention;

FIG. 5 is a logic diagram of the testbench menu of FIG. 4; and

FIG. 6 is a block diagram of a probe core generator.

DETAILED DESCRIPTION OF THE PREFERRED EMBODIMENTS

The present invention may provide a system for building a sub-core synthesizable module that may read, compare, and store probe points of interest. Probe points may be extracted from the simulation probe nets file. The system for integrating the probe point sub-core with the core may be implemented such that the system on a chip (SOC) on-chip bus interface is commonly the access path to the core and the sub-core. A variety of bus access options may be implemented to the core and sub-core. The sub-core may be implemented as part of an on-chip bus that goes off chip. The system for programming the available probe points may write and read prior to, or during, silicon functional operation. A system may be implemented for uploading the probe points results to the simulation testbench for analysis and optionally to load simulation with initial state information to implement simulations. An extensive set of probe core generator parameters may also be implemented.

Referring to FIG. 1, a block diagram of a circuit 100 is shown in accordance with the present invention. The circuit 100 generally comprises a memory circuit 102, a memory circuit 104 and a circuit (or tool) 106. In one example, the memory circuit 102 may be a 32 K×24 memory, and the memory circuit 104 may be a 64 K×32 memory. However, other memory configurations may be implemented to meet the design criteria of a particular application. The memory circuits 102 and 104 may load information into the circuit 106.

The circuit 102 may have an input/output 108 that may receive or send a signal from the circuit 106. The circuit 102 may present an address signal (e.g., ADDR1) to an output 110 of the circuit 106. The signal ADDR1 may be n-bits wide, where n is an integer. In one example, n may equal 24. The circuit 104 may have an input/output 112 that may receive or send a signal from the circuit 106. The circuit 104 may present an address signal (e.g., ADDR2) to an output 114 of the circuit 106. The signal ADDR2 may be n-bits wide, where n is an integer. In one example, n may equal 32. The circuit 106 may have an input/output 116 that may present an input and/or output signal.

The circuit 106 generally comprises a circuit 118, a circuit 120, a circuit 122, a plurality of circuits 124a–124n and a circuit 126. In one example, the circuit 118 may be a memory interface, however, other circuits may be implemented to meet the design criteria of a particular application. In one example, the circuit 120 may be a C model C2RTL and the circuit 122 may be a 24 bit DSP function, however, other circuits may be implemented to meet the design criteria of a particular application.

The circuit 120 may be configured to present a signal to the circuit 118 at an input/output 128. The circuit 122 may be configured to present a signal to the circuit 120 at an input 130. The circuit 122 may be configured to present a signal to the circuit 118 at an input/output 128. The circuit 122 may be configured to present and/or receive one or more signals to each of the plurality of circuits 124a–124n. The plurality of circuits 124a–124n may each be configured to present and/or receive one or more signals to the circuit 126 at an input 134.

The circuit 120 generally comprises a circuit (or module) 140 and a circuit (or module) 142. In one example, the circuit 140 may be a Tamarin C model C2RTL synthesized to 35 kg and the circuit 142 may be a C model C2RTL synthesized to 10 Kg. However, other circuits may be implemented to meet the design criteria of a particular application. The circuit 142 may be configured to receive one or more signals to the input 130 from the circuit 122. The circuit 142 may be configured to receive one or more signals from an output 144 of the circuit 140. The circuit 140 may be configured to present and/or receive one or more signals from the input/output 128 of the circuit 118.

The circuit 122 generally comprises a circuit (or module) 150 and a circuit (or module) 152. In one example, the circuit 150 may be non-memory I/O and the circuit 152 may be a Tamarin verilog model synthesized to 25 Kg. However, other circuits may be implemented to meet the design criteria of a particular application. The circuit 152 may be configured to present and/or receive signals from the input/output 128 of the circuit 118.

FIG. 1 illustrates an exemplary solution proposed for Tamarin, a 24-bit DSP function, that generally satisfies all the requirements in "DVD Systems, Silicon Verification Perspective, 3-13-96" (which is hereby incorporated by reference in its entirety) with the exception of the "Sil Ver & Sim Ver Linkage tools" portion. The testbench generally has the single cycle, single step and trigger condition support. With the simulation testbench embedded, a close linkage between simulation and silicon may be implemented. A single board design may be implemented for the Tamarin FPGA 100 that may handle verification for the Tamarin DSP function, as well as code running on the DSP function, like virtualizers or an audio encoder like Dolby Digital, DTS, etc. The SiBP is useful for testbench independence from the module, and may be used in applications that cost justify the added value. The C2RTL tool 106 is generally used to embed the testbenches.

A simulation may provide easy methods to define points or nets in RTL or gate level models. Such a simulation list of probe points may then be read by the probe core generator. The list may be filtered. The probe core generator may build a core that may enable access to the probe points in silicon. With the use of an on-chip bus (e.g., a SiBP bus, as available from Sonics Corp.) the core 102 is actually a sub-core inside a module linked to the SiBP bus. The sub-core may be used in the SiBP compile (to be described in more detail in connection with FIG. 6). The first three steps may be provided in an RTL simulation and step 4 may be provided in the FPGA or silicon. In Step 2, the testbench may be designed to optionally display, save, or re-load with, results and probes. The process may be made easier with SiBP involved, which may provide an on-chip bus provides a framework for accessing the probe points.

Among the core generator parameters are initial build or add/subtract probe points. The SiBP Parameter selection may include slot, bus width, bus speed, FIFO depth, bandwidth allocation, address width, address assignment, etc.

The probe active read or stored read may include (i) an option to record an on time stamp from reset, (ii) an option to record a probe point change, (iii) option to read probe points as another module address, (iv) record or read on clock cycle, every 'n' cycle, every slot access, at specific times, (v) read a specific sub-set of available probes, special read dump option, where normal bus slot assignment is suspended for selective probe active or stored value read, typically used for many probe reads across module boundaries, (vi) an option for a sequential dump of all probes, (vii) probe buffer size defined, chip level SiLP parameters (e.g., direct or indirect feed of probe points from modules) and (viii) an option to upload results and probes to simulation.

In one example, the present invention may use C2RTL, or RTL synthesis tools, to map simulation testbenches (TB) to silicon, such that they are substantially embedded. The present invention may use a bus structure for SOC module and TB interconnect to make verification easier and reusable as well as techniques for C-model to HDL model verification and a system for verification using embedded testbenches.

The verification of C-model to HDL model may be performed at speed in FPGAs or silicon. Formal verification does not perform C-model vs HDL model, but only HDL model vs gate.model. A C-model compare to HDL model, at speed, may be a value added feature. FPGA or silicon verification of HDL modules using embedded testbenches with a bus structure may make testbench interfaces independent of the modules.

A system for silicon verification using embedded testbenches may leverage simulation of functional verification and may be enabled to run on silicon. Typically, these testbenches will be for C or RTL model verification, but gate level (e.g., leveraging automatic extraction for netlist simulation) may be considered as well. Proprietary testbenches may also be used. Verification language testbenches, such as Vera or "e" (commercially available from Verisity), may add significant value to usefulness and verification progress measurement. All such testbenches may be developed such that they may run FPGA or silicon as well as simulation models. Such a multiuse design may accelerate time to revenue for developments.

The present invention may provide simulation testbenches. If the testbench is developed in RTL that is synthesizable, a hardware emulation box (e.g., commercially available from Quickturn) may be used. Such an approach is essentially simulation acceleration. Also, products are commercially available that allow simulation of testbenches to run with emulation of the design. Both of these systems are expensive and a challenge to use.

If the testbench is implemented in C code and is decoupled from specific cycle accurate event timing, the C code may run on a local processor. A program implemented in C code may monitor the implemented silicon after stimulus sequences are applied. Leveraging the TBus concept from other projects, nodes within the modules are probed and modules are isolated, which is limited in usefulness since it lacks cycle accuracy.

If the testbench can be designed to have an I/O interface, mapped to PCI or SiBP/SiLP or another common bus, such standardization may enable simulation testbench to run on silicon (even just a module in an FPGA) with much greater ease. An SDRAM bus alone is not generally adequate, since an SDRAM is target only. Initiation capability from the testbench is needed. The SimTB running on silicon may enable (i) testbenches to run at speed, (ii) testbench design to become easier to implement, (iii) testbenches to be re-used more easily, (a) other modules to leverage testbench that use the same bus structure, (b) testbench stimulus and analysis that may be more uniform and leveraged such as specific field random pattern generation or formatting output for analysis and feed of stimulus and capture of results down to clock level is enabled, (c) a testbench that may be independent of module, and therefore be used for other module verification, (iv) a testbench that may be interactive at speed to verify modules, (specific testbench features or tests or checking may be enabled in real-time), (v) functional self-test, at speed, is enabled. (Often, the C-model of the module is available. This can be embedded using C2RTL tools, as well as a compare capability. Normal operation can be occurring, an error detected, re-run of the events on the C-model in gates to see if same error occurs) and/or (vi) C versions of popular third party verification tools or tool outputs, such as Vera or Verisity may be embedded, using C2RTL tools. Such an implementation may include controls, features, parameters of the use of the tools.

Two bus candidates for implementing the present invention may be the PCI and/or SiBP/SiLP busses. These are reviewed with the concept of using an Integra PCI card and Interra DSK software.

A PCI implementation may incorporate a bus wrapper to FPGA of module. FIG. 4 illustrates an example of the FPGA that may be on daughter card to Integra PCI card with Interra DSK software (with upgrade for capture). Such an implementation is limited to PCI or Integra CPU bus interface to the modules under test, which are not candidates to integration to the silicon and thus are not candidates for simulated testbenches.

A SiBP/SiLP implementation may be candidate for integration to the silicon and thus a candidate for building simulation testbench capabilities. The SiBP is generally implemented on-chip, usually fast and wide enough to handle all major modules interfacing, including SDRAM. The board may be implemented as an Integra PCI based card and may enable feed and capture. Integra card has CPU and A/V decoder daughter cards, both with AMCC PCI bus feed of address and data. The CPU daughter card slot is recommended since this has all address and data. Unused pins on the MIPs CPU modules connector may be used to connect to an Integra PCI DAC or NTSC Encoder. Using the Integra PCI may enable leveraging of existing Interra DSK software.

A SOC implementation of the present invention may introduce a single fast on-chip bus for all core communication. Such an implementation may simplify design, guarantee performance, consume less area, enable core plug and play, reduce on-chip FIFOs with the implementation of unified memory architecture, and enable bandwidth to be dynamically allocated. In one example, such an approach may consume 50 to 500 gates per module. The SOC implementation may also have a scan-based access to a bus. For DVD source decoder and DVD video encoder designs (such as those commercially available from LSI logic), analysis of data flow, control flow, dedicated clock frequencies, SDRAM bandwidth needs, real-time flow, transaction frequency and TDMA slot assignment are needed to define bus width, speed, FIFO depths and assignment of out-of-band signals.

The present invention may compete with a PCI interface solution, while offering better tools for wrapping a core. Cores may have very different I/O and bandwidth needs. SiBP provides single set of tools to enable interfacing to all cores. This may enable more generic verification capabilities of cores. The present invention may be implemented in one testbench on silicon evaluation infrastructure and then perhaps on different daughter boards, where needed. SiLB may enable FPGA chips to be easily added using a common bus.

Using C2RTL tools, a C model of the module may be synthesized and compared, at the operating speed of the module. C2RTL may be used to map the entire testbench to silicon. If the testbench is already in RTL, this may be synthesized to the FPGA.

In one example (e.g., FIG. 1), a single daughter card (e.g., an Integra daughter card) may be implemented with the capability to download the program to SRAM, run diagnostics, verify normal operation, and/or run the simulated testbench.

In one implementation, SiLP for an FPGA interface may enable easily adding additional FPGAs. SiLP is a 100 MHz, 50 pin, 32-bit, 400 MB/sec bus. In general, a PCI interface operates at 33 MHz and may be a 32-bit design (such parameters may be limited by current designs of Integra board, which could be upgraded to a speed of 66 MHz, and a 64-bit width). As such, a PCI interface may operate at 132 MB/sec, if PC memory can support such a rate. In one example, SiLP could be slowed to operate at the rate of the PCI interface. A MIPS CPU module on an Integra board or compatible, may provide 32-bit data, 32 bit address, 27 MHz (preliminary review). In general, a MIPs CPU Module connector interface to SiLP interface will be either on separate FPGA or integrated into the FPGA. A separate FPGA would enable ease to add additional FPGAs.

The present invention may be used for verification of processor, virtualizers and encoders. For virtualizer verification, an output to audio DAC is generally provided. Other verifications mentioned may not have significant external standard part or interface needs for verification. In one example, a single daughter card may be implemented with virtualizer verification, with a large FPGA capability that may be used in other designs. Such an implementation may minimize multiple card designs. See FIG. 1 illustrating Tamarin FPGA Verification. Using C2RTL tools, the Tamarin C model may be synthesized in gates and may run in parallel to the RTL synthesized model. A compare may be done and the results may be stored. Such an implementation may provide the simulation verification environment. The use of an evaluation platform may be expanded to architecture evaluation, performance analysis and improvement.

Another project candidate to implement simulation testbenches in FPGAs is a DVD source decoder (e.g., available commercially from LSI logic). The source decoder design application may be restricted to no outputs (e.g., an NTSC Encoder or an audio DAC). In such an implementation, a daughter card may be used. Verification of new modules, such as pre-parser, may be done. The SiBP snoop function may be an alternative to SiLP, and will not generally be loaded on the SDRAM bus.

The source decoder in silicon applications can have a daughter card used for a number of implementations. If the particular daughter card does not have SPDIF support, such support generally has to be solved in another way (e.g., verification of modules in silicon, verification of the chip in silicon, etc.).

Referring to FIG. 2, a block diagram of a circuit 100' is shown. In one example, the circuit 100' may be a video encoder implementation (e.g., such as a video encoder commercially available from LSI Logic). The circuit 100' generally comprises a circuit 202, a circuit 204 and a circuit 206. The circuit 202 may have a bus input/output 208 that may present a signal. The circuit 204 may have a bus input/output 210 that may present a signal. The circuit 206 may have a bus input/output 212 that may present a signal.

The circuit 202 generally comprises a memory circuit 220 and a circuit 222. In one example, the memory circuit 220 may be a 64 K×32 Sync Cache SRAM. However, other memory configurations may be implemented to meet the design criteria of a particular application. In one example, the circuit 222 may be an Altera Flex 10 K EPF10K250A however, other circuits may be implemented to meet the design criteria of a particular application. The memory circuit 220 may be configured to present and/or receive one or more signals to an input/output 224 of the circuit 222. The input/output 224 may be n-bits wide, where n is an integer. In one example, n may equal 32.

The circuit 222 generally comprises a circuit 230, a circuit 232, a circuit 234, a circuit 236 and a circuit 238. In one example, the circuit 230 may be a memory interface and the circuit 232 may be a C-model C2RTL. However, other circuits may be implemented to meet the design criteria of a particular application. The circuit 230 may be configured to present a signal to an input/output 226 of the circuit 234. The circuit 234 may be configured to present a signal to an input/output 228 of the circuit 238. The circuit 236 may be configured to present a signal to an input 228 of the circuit 238. The circuit 238 may be configured to present the input/output signal at the input/output 208.

The circuit 204 generally comprises a memory circuit 240, a circuit 242 and a memory circuit 244. In one example, the memory circuit 240 may be a 64 K×32 memory and the memory circuit 244 may be a 16 Mb SDRAM. However, other memory configurations may be implemented to meet the design criteria of a particular application. In one example, the circuit 242 may be an Altera Flex 10 K EPF10K250A, however, other circuits may be implemented to meet the design criteria of a particular application. The memory circuit 240 may be configured to present a signal to the circuit 242 at an input/output 246. The circuit 242 may be configured to present one or more input/output signals to the memory circuit 244 at an input/output 248.

The circuit 242 generally comprises a circuit 250, a circuit (or module) 252, a plurality of circuits 254a–254n, a circuit 256 and a circuit 258. In one example, the circuit 252 may be a C-model C2RTL. However, other circuits may be implemented to meet the design criteria of a particular application. The circuit 250 may be configured to present one or more input/output signals to each of the circuits 254a–254n. The circuits 254a–254n may be configured to present one or more input/output signals to the circuit 258 at an input/output 259. The circuit 256 may be configured to present an input/output signal to the circuit 258 at the input/output 259. The circuit 258 may have an input/output 210 that may present the output signal.

The circuit 206 generally comprises a circuit 260. In one example, the circuit 260 may be an Altera EPF10K250A. The circuit 260 generally comprises a circuit 262, a circuit 264, a plurality of circuits 266a–266n, a circuit 268 and a circuit 270. In one example, the circuit 264 may be a C-model C2RTL. However, other circuits may be implemented to meet the design criteria of a particular application. The circuit 262 may be configured to present one or more input/output signals to each of the circuits 266a–266n. The circuits 266a–266n may be configured to present one or more input/output signals to the circuit 270 at an input/output 272. The circuit 268 may be configured to present one or more input/output signals to the circuit 270 at an input/output 272. The circuit 270 may be configured to present the input/output signal at the output 212.

FIG. 2 illustrates a daughter card approach that may be used since no DACs are needed. The video encoder has significant gate size, so multiple sockets/FPGAs may be needed on the daughter card. Verification of individual modules and groups of modules may also be needed. Example of an appropriate daughter card may have ME and SDRAM modules implemented in FPGAs, with SDRAM memory attached. Uncompressed video may be 720×480× 16 (422) per frame, or 20 MB/sec. In general, a PCI bus can handle such data rates.

Referring to FIG. 3, a detailed diagram illustrating the circuit 100', implemented in silicon, is shown. The circuit 100' generally comprises a circuit 300, a circuit 302, a circuit 304, a circuit 306, a memory circuit 308, a circuit 309, a circuit 310, a circuit 312, a circuit 314, a circuit 316, a circuit 318, a circuit 320, a circuit 322, a circuit, 324 and a circuit 326. In one example, the circuit 300 may be a video interface. In one example, the circuit 302 may be a noise and horizontal filter. In one example, the circuit 304 may be a programmable filter. In one example, the circuit 306 may be a central processing unit. In one example, the memory-circuit 308 may be an SDRAM. In one example, the circuit 310 may be a rate control quantity select. In one example, the circuit 312 may be a SDRAM interface. In one example, the circuit 316 may be a motion estimation engine. In one example, the circuit 318 may be a mode decision circuit. In one example, the circuit 320 may be a reconstruction circuit. In one example, the circuit 322 may be a transformation circuit. However, other circuits may be implemented to meet the design criteria of a particular application.

The circuit 300 may have an input 350 that may receive an input signal (e.g., VIDEO_STREAM). The circuit 300 may be configured to present a signal to an input 352 of the circuit 302 in response to the signal VIDEO_STREAM. The circuit 302 may be configured to present a signal to an input 354 of the circuit 326. The circuit 304 may be configured to receive a signal from the circuit 326 at an input/output 356. The circuit 304 may be configured to present a signal to the circuit 326 at an input/output 358. The circuit 306 may receive a signal from the circuit 326 at an input/output 360. The circuit 306 may receive a signal from the circuit 310 at an input 362. The circuit 306 may be configured to present a signal to the circuit 326 at an input/output 364. The circuit 306 may be configured to present a signal to the circuit 310 at an input 366. The circuit 310 may be configured to present a signal to the circuit 322 at an input 368. The memory circuit 308 may receive a signal from the circuit 309 at an input/output 370. The memory circuit 308 may be configured to present a signal to the circuit 309 at an input/output 372. The circuit 309 may receive a signal from the circuit 312 at an input/output 374. The circuit 309 may present a signal to the circuit 312 at an input/output 376. The circuit 312 may receive a signal from the circuit 326 at an input/output 378. The circuit 312 may be configured to present a signal to a circuit 326 at an input/output 380.

The circuit 316 may receive a signal from the circuit 326 at an input/output 382. The circuit 316 may be configured to present a signal to the circuit 326 at an input/output 384. The circuit 316 may be configured to present a first signal to the circuit 318 at an input 386 and a second signal to the circuit 318 at an input 388. The circuit 316 may be configured to present a signal to the circuit 320 at an input 390. The circuit 318 may be configured to present a signal to the circuit 326 at an input/output 392 and a signal to the circuit 322 at an input 394. The circuit 320 may receive a signal from the circuit 322 at an input 396. The circuit 320 may be configured to present a signal to the circuit 326 at an input 398. The circuit 322 may be configured to present a signal to the circuit 326 at an input 400 and a signal to the circuit 324 at an input 402. The circuit 324 may receive an input signal (e.g., ENCODED_AUDIO) at an input 404. The circuit 324 may receive a signal from the circuit 326 at an input/output 406. The circuit 324 may present a signal to the circuit 326 at an input/output 408. The circuit 324 may be configured to generate an output signal (e.g., MPEG_BITSTREAM).

The circuit 324 generally comprises a circuit 440, a circuit 442 and a circuit 444. In one example, the circuit 440 may be a stream multiplexer. In one example, the circuit 442 may be a VLE circuit. In one example, the circuit 444 may be an audio circuit. However, other circuits may be implemented to meet the design criteria of a particular application. The circuit 442 may be configured to present a signal to the circuit 440 at an input 446. The circuit 444 may be configured to present a signal to the circuit 440 at an input 448 in response to the signal ENCODED_AUDIO. The circuit 440 may be configured to generate the signal MPEG_BITSTREAM.

The video encoder in silicon is shown in FIG. 3, where the Integra daughter card approach may be used. A single socket for the video encoder is generally used. Verification may be provided for individual modules, groups of modules and full chip level. Such an implementation may provide a demo of chip capability for markets such as video email, DVD authoring, video editing, TV recording, etc.

An example of a Tamarin in a FPGA implementation of the present invention will be elaborated. A daughter card for a Tamarin FPGA to fit on a CON3 (e.g., a CPU module) may be built. Such an implementation generally uses a CPU module and may have all 32-bits of PCI data and all PCI address. CON2 may be decoded from a CON3, so it cannot normally be used. Leveraging two channels of DAC output on a daughter board for virtualizer verification may be implemented with jumpers from CON3 and CON2 to audio DAC signals. To leverage NTSC out on Integra board (e.g., for source decoder verification), consider jumpers from CON3 to CON2 to NTSC signals.

A Tamarin FPGA with PCI bus may be fed and captured from testbenches running on a PC. Testbenches may be vectors stored on a fixed disk, fed to Tamarin, then captured back to the fixed disk where the results may be accessed. If a random instruction block is being executed, the results may be directly compared to the C-model in the FPGA. If a virtualizer is being verified, the bitstream may be feed from the fixed disk and may be processed by Tamarin and output to speakers directly.

To migrate testbenches to silicon, testbenches on PC platform may basically be driving vectors in, capture vectors out, like fast simulations for Tamarin. With Si BP, the module interface is a bus, so bus transactions are the testbenches. The testbenches may be built with such a bus wrapper on the module, and may have the testbenches manifested in the another module with bus wrapper. If the testbenches need to be interactive, the simple piping vectors will not work. Such an implementation may require the testbenches to be synthesizable. The testbenches may run locally on a processor.

Referring to FIG. 4, an illustration of a circuit 100" is shown. In one example, the circuit 100" may be a probe core system. The circuit 100" generally comprises a circuit 500, a circuit 502 and a circuit 504. In. one example, the circuit 500 may be a display, the circuit 502 may be a PC and the circuit 504 may be a KYB. However, other circuits may be implemented to meet the design criteria of a particular application. The circuit 504 may be configured to present one or more input/output signals to the circuit 502 at an input/output 506. The circuit 502 may be configured to present or send a signal to the circuit 500 at an input/output 508.

The circuit 500 generally comprises a circuit 510 and a circuit 512. In one example, the circuit 510 may be a DSK menu circuit and the circuit 512 may be a test bench menu circuit. The circuit 502 generally comprises a PCI card 512. The PCI card 512 generally comprises a daughter card 516 with one or more embedded test benches 518.

FIG. 5 illustrates the probe core system menus of FIG. 4. FIG. 5 comprises a DSK menu 600, a Tamarin sim TB in Si menu 602 and a 050 sim TB in Si menu 604. The DSK menu 600 selects either the menu 602 or the menu 604.

The menu 602 comprises the following primary steps: (i) load program memory; (ii) enabling capture; (iii) comparing to embedded C model; (iv). feeding bitstreams (bs); (v) stop; and (vi) stop on mis-compare. Step (i) (load program memory) further comprises loading parameters of Tamarin operation. Step (ii) (enabling capture) further comprises enabling: (a) all output; (b) probes; (c) performance probes; (d) clock speed; (e) timeout; (f) Tamarin verification parameters; and (g) AE verification parameters. Step (iii) (compare to embedded C model) further comprises comparing parameters of C model operation.

The menu 604 comprises the following primary steps: (i) load tiny RISC program memory, (ii) enabling capture, (iii) comparing to embedded C model, (iv) feeding bs, (v) stop, and (vi) stop on mis-compare. Step (i) (loading tiny RISC program memory) further comprises loading parameters of 050 operation (clock speed, timeouts and encoding parameters). Step (ii) (enabling capture) further comprises enabling: (a) all outputs; (b) probes; (c) performance probes; (d) clock speed; and (e) timeout. Step (iii) (compare to embedded C model) further comprises comparing parameters of C model operation.

FIG. 6 illustrates a probe core generator system. The probe core generator system generally comprises a block 700, a block 702, a block 704, a block 706 and a bus 708. In one example, the block 700 may comprise a netlist. In one example, the block 702 may comprise a list of probe points. In one example, the block 704 may comprise a probe core generator. In one example, the block 706 may comprise a netlist with a probe sub-core. However, other blocks and/or circuits may be implemented to meet the design criteria of a particular application. The block 700 generally permits a user to generate the list of probe points 702. The netlist 700 and the list of probe points, 702 are both generally presented to the probe core generator 704. The probe core generator 704 may present a signal to the netlist 706. The netlist 706 may be configured to present a signal to the bus 708.

The present invention may provide one or more of the following advantages:

(A) Embedded probe point real-time and stored state information may be programmed into silicon with the testbench in a systematic way. Embedded probe point capability may be built from simulation probe point information directly or indirectly;

(B) Extensive list of probe core generator parameters may enable optimum access to probe points in silicon with minimal impact on design. Options may be included for capture on changes only and capture at a specific time;

(C) Incremental builds may add or subtract probe points automated and in terms of implementation in FPGAs and may provide quick access;

(D) For testbenches embedded in silicon for verification of external SOC devices like DACs (or bus-functional models such as 1394) may have a model of a function that is not yet in silicon, or integrate entire SOC simulation environment models like random bitstream generators for MPEG2 Decode, systematic probe points into these models provides operation information useful to SOC verification. The testbench may be representing models that are for verification or performance or for analysis and not intended as part of the final product operation. Reusable testbench components may be shared by various testbenches that are embedded, with probe points common and specific; and/or (E) Evaluation system to leverage embedded testbench probes, with menu programming for extracting probe information available from silicon. On an embedded testbench that has a C-model manifested to compare to an RTL model manifested, on a miscompare, the test suite may be re-launched with relevant probe point information capture enabled. Performance probe analysis may be launched, running specific testbench sequences to assess performance, optionally self-test and/or gathering statistics on performance.

The testbench can include loading up program memory of the modules or chip under test. The testbench can include extracting probe information and loading simulation with this information either directly or indirectly. Field diagnosis on issues may be done with embedded testbenches with probe points accessible to the system with silicon. For example, diagnostic registers may enable the testbench to run as a standalone for self-test or as a probe point information extraction.

In an alternate embodiment, part of the invention may be implemented (e.g., support for evaluation system that on an embedded testbench that is a C-model manifested and being compared to the RTL model manifested) on a mis-compare in the operation. The embedded testbench may automatically relaunch the test and capture relevant probe point information such that it is useful in diagnosing the issue. Such a relaunch is essentially a programming of probe-points to capture and how and when to capture them.

Simulation testbenches (or the simulator) may enable a user to probe specific model points. Such flexibility is useful in assessing operation information. The present invention may extend such simulation to silicon, using embedded testbenches. Fundamental operations, such as stop when probe x is active high, or start when not reset and module n probe point y is active, or run for 200 clocks after a probe point is inactive or dump all set C probe points and load a simulation, may be implemented. The present invention may enable embedded testbenches in silicon to have the look and feel of simulation with the speed of silicon. Silicon verification with visibility to internal probe points in a manner that blends with simulation may save months of verification effort on a typical SOC.

While the invention has been particularly shown and described with reference to the preferred embodiments thereof, it will be understood by those skilled in the art that various changes in form and details may be made without departing from the spirit and scope of the invention.

What is claimed is:

1. A method for inserting and reading one or more probe points in a silicon embedded testbench comprising the steps of:
    (a) inserting and reading a simulation list of probe points;
    (b) enabling access to the list of probe points;
    (c) generating a core;
    (d) displaying or comparing the probe points;
    (e) embedding probe point capability from simulation probe point information; and
    (f) systematically programming embedded probe type real time and stored state information into the silicon with said testbench.

2. The method according to claim 1, further comprising the step of:
    prior to step (c), filtering said list.

3. The method according to claim 1, wherein said core is built in silicon.

4. The method according to claim 3, wherein a sub-core may be part of an on-chip bus that may present information off chip.

5. The method according to claim 1, wherein the probe points are written to and read from prior to or during a silicon functional operation.

6. The method according to claim 1, further comprising:
    uploading probe point results in a simulation testbench or analysis tool; and
    optionally loading the simulation testbench or analysis tool with one or more initial statement information parameters received from the simulations.

7. The method according to claim 1, further comprising:
    generating an extensive set of probe core generator parameters, reflecting common simulator capabilities including capture changes only or capture starting at a specific time point.

8. The method according to claim 1, wherein step (e) comprises:
    embedding probe point capability, directly or indirectly, from said simulation probe point information.

9. The method according to claim 1, further comprising the step of:
    implementing an extensive list of probe core generator parameters allowing optimum access to probe points in silicon with minimal impact on design.

10. The method according to claim 9, further comprising the step of:
    automatically and incrementally building to add or subtract probe points.

11. The method according to claim 10, wherein said probe points provide operation information useful to a system on a chip verification.

12. The method according to claim 10, wherein:
    (a) said testbench represents models that are for verification, performance or analysis; and
    (b) said testbench is not intended as part of a final product operation.

13. The method according to claim 12, wherein one or more reusable testbench components can be shared by one or more second testbenches.

14. The method according to claim 13, wherein said second testbenches are embedded with said probe points that are common and specific.

15. The method according to claim 14, further comprising the step of:
    implementing an evaluation system to leverage embedded testbench probes.

16. The method according to claim 15, further comprising the step of:
    implementing menu programming for extracting probe information available from silicon.

17. The method according to claim 16, wherein a test suite can be re-launched on a mis-compare with relevant probe point information capture enabled.

18. The method according to claim 16, wherein a performance probe analysis can be launched for:
- (a) running specific testbench sequences to assess performance;
- (b) performing a self-test; and
- (c) gathering statistics on performance.

19. The method according to claim 18, further comprising the step of:
  loading program memory of a module or a chip set.

20. The method according to claim 19, further comprising the steps of:
  extracting probe information; and
  loading simulation information.

21. The method according to claim 20, further comprising the step of:
  conducting field diagnosis with said embedded testbenches comprising said probe points accessible to the system.

22. An apparatus comprising:
  means for reading a simulation list of probe points;
  means for enabling access to the list of probe points;
  means for generating a core;
  means for displaying or comparing the probe points;
  means for embedding probe point capability from simulation probe point information; and
  means for systematically programming embedded probe type real time and stored state information into the silicon with said testbench.

23. An apparatus comprising:
  a first module configured to read a simulation list of probe points and enable access to said list of probe points;
  a second module configured to generate a core;
  a third module configured to display or compare probe points;
  a fourth module configured to embed probe point capability from simulation probe point information; and
  a fifth module configured to systematically program embedded probe type real time and stored state information into the silicon with said testbench.

* * * * *